United States Patent [19]
Carter

[11] Patent Number: 6,089,472
[45] Date of Patent: Jul. 18, 2000

[54] SHOWER HEAD

[75] Inventor: Steven Carter, Weston-Super-Mare, United Kingdom

[73] Assignee: Trikon Equipments Limited, Newport, United Kingdom

[21] Appl. No.: 09/094,561

[22] Filed: Jun. 15, 1998

[30]     Foreign Application Priority Data

Jun. 16, 1997 [GB]   United Kingdom ............... 9712400

[51] Int. Cl.[7] .............................. F23D 11/16; B05B 7/06
[52] U.S. Cl. ........................................... 239/422; 239/424
[58] Field of Search ................................ 239/422, 423, 239/424; 118/725

[56]           References Cited

U.S. PATENT DOCUMENTS

| 4,284,242 | 8/1981 | Randell ................................... 239/423 |
| 5,427,317 | 6/1995 | Huttlin ................................... 239/422 |
| 5,595,606 | 1/1997 | Fujikawa et al. ........................ 118/725 |
| 5,810,252 | 9/1998 | Pennamen et al. ..................... 239/423 |

FOREIGN PATENT DOCUMENTS

| 0687749 A1 | 6/1995 | European Pat. Off. . |
| 4035951 C1 | 11/1990 | Germany . |
| 2219311 | 12/1989 | United Kingdom . |

*Primary Examiner*—Andres Kashnikow
*Assistant Examiner*—Davis Hwu
*Attorney, Agent, or Firm*—Jones Volentine, LLP

[57]           ABSTRACT

This invention relates to showerheads for delivering gases to reactor chambers. The showerhead 18 comprises a casing 19, which includes a backing plate 20, first and second baffle plates 21, 22 and an outlet plate 23. Baffle plates 21 and 22 divide the volume defined by the casing 19 into plena 24, 25 and 26. A gas supply 27 feeds the plenum 24, a gas supply 28 feeds the plenum 25 and a further gas supply 29 feeds the plenum 26. The outlet plate 23 has an array of openings 30 and each of the baffle plates 21, 22 has a tube for each opening 31. The tubes and outlets together define concentric but separate outlets for the respective plena.

9 Claims, 2 Drawing Sheets

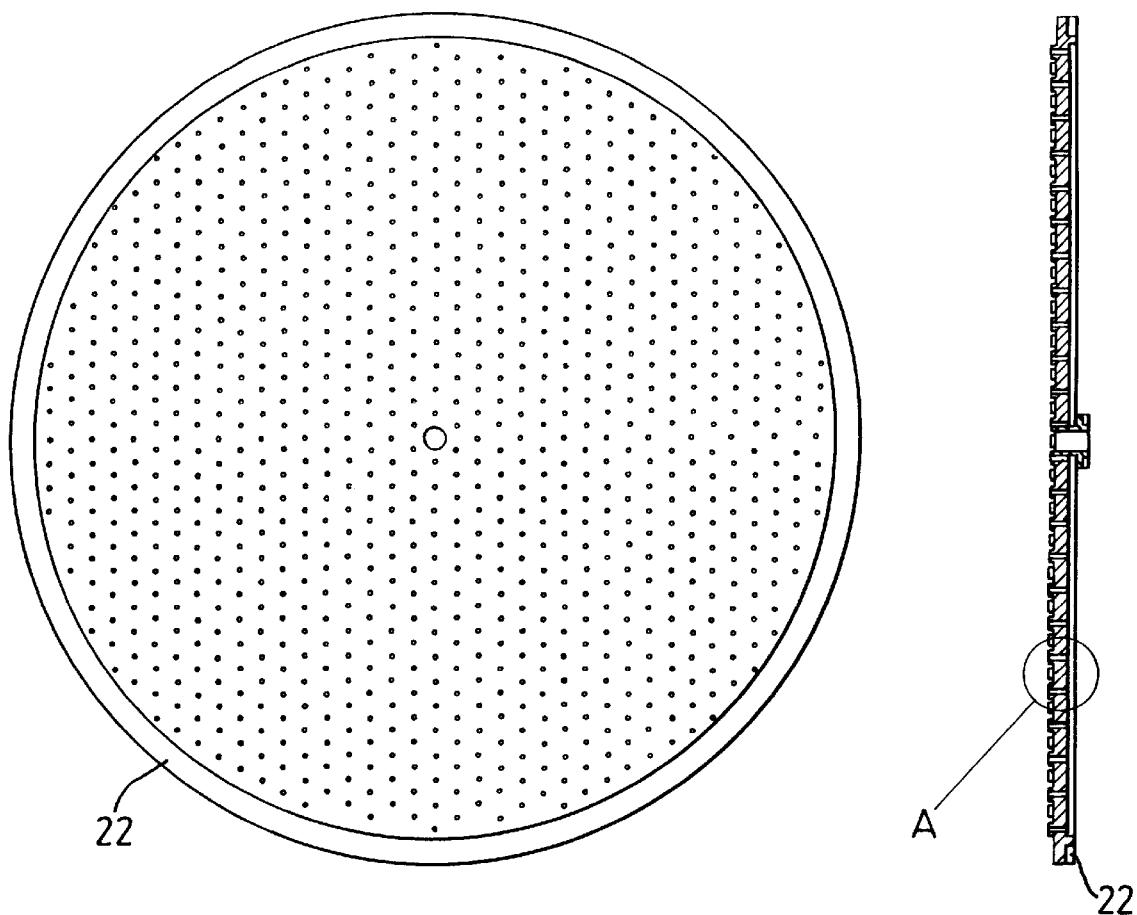
Fig. 3  Fig. 4
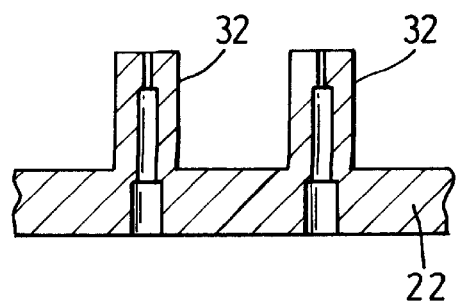
Fig. 5

SHOWER HEAD

BACKGROUND OF THE INVENTION

This invention relates to shower heads for delivering gases to reactor chambers.

In many processes, such as plasma etching, chemical vapour deposition and plasma enhanced vapour deposition, it is desirable to introduce into a reactor chamber two or more gases or vapours relatively evenly throughout the chamber. This is generally achieved by a device known as a shower head and typically these comprise a casing defining a volume and having an outlet plate defining a plurality of openings. However in some processes it is necessary to deliver the gases or vapours in such a way that the gases are delivered, but not mixed until they enter the chamber. This is frequently achieved by a baffle plate that extends across the volume defined by the showerhead casing to define first and second gas plena or respective sides thereof. The first plenum is on the outlet side of the baffle plate and is essentially defined between a series of tubes, which project downwardly from the baffle plate to communicate the second plenum (on the other side of the baffle plate) with the openings in the outlet plate. An apertured rubber gasket is provided between the outlet plate and the ends of the tubes to seal the passages defined by the tubes from the first plenum. Where a tube engages the rubber gasket, gas can pass through the openings in the gasket and the aligned openings in the outlet plate. The other openings in the gasket serve to communicate the first plenum with their associated openings in the outlet plate.

This design creates a number of problems. Firstly the gasket must be accurately matched up to the holes in the outlet plate and a certain pressure is need to maintain a seal between the outlet plate and the gasket. It is preferred that the outlet plate is made with aluminium, because it is suitable for many processing reasons, but aluminium is relatively flexible and it has become progressively more difficult to maintain a good seal as shower head dimensions have increased along with the increase in the dimensions of the wafers to be processed. Attempts to overcome these problems using fastenings have disrupted the continuous surface of the outlet plate and are potential sources of contamination, particle generation and lack of uniformity of processing. Further on occasions a plasma can ignite within the cavities of the shower head causing damage to the gasket and plasma activity can react with any iron-based fastenings within the shower head causing contamination.

SUMMARY OF THE INVENTION

The present invention consists in a shower head for delivery unmixed gases or vapours to a reactor chamber including a casing defining a volume and having an outlet plate defining a plurality of openings and a baffle plate extending across the volume to define first and second gas plena on respective sides thereof, the first plenum being on the outlet side of the baffle plate and the baffle plate having projecting tubes passing through the first plenum to communicate with respective openings, characterised in that the tubes project into the plenum to define, with respective openings, circumjacent outlets for the first plenum.

Preferably the first plenum is in direct communication with the circumjacent outlets.

The shower head may further include a further baffle plate located on the other side of the second plenum from the first baffle plate to define with the casing, or an extension thereof, a third plenum, the further baffle plate having further tubes which extend through respective ones of the first sets of tubes to form further outlets.

Preferably the areas of the tube outlets and the circumjacent outlets are substantially equal and the outlets in each group of outlets may be concentric.

It will be understood that in fact, in principle, a number of baffle plates can be used to define a number of plena and in each case their tubes will extend downwardly through the tubes of the intermediate baffle plates. Clearly the number of tubes which can accommodated while still providing outlets of acceptable dimensions is limited, but the precise limitations will depend on the dimensions of the outlet plate and the openings therein.

Although the invention has been defined above it is to be understood that it includes any inventive combination of the features set out above or in the following description.

BRIEF DESCRIPTION OF THE DRAWINGS

The invention may be performed in various ways and a specific embodiment will now be described, by way of example with reference to the accompanying drawings in which:

FIG. 3 is a view from below of a baffle plate for use in a 'two gas' version of a shower head;

FIG. 4 is a cross-section through the plate of FIG. 3; and

FIG. 5 is an enlarged detail of A in FIG. 4.

DETAILED DESCRIPTION OF THE PREFERRED EMBODIMENTS

Figure 1:
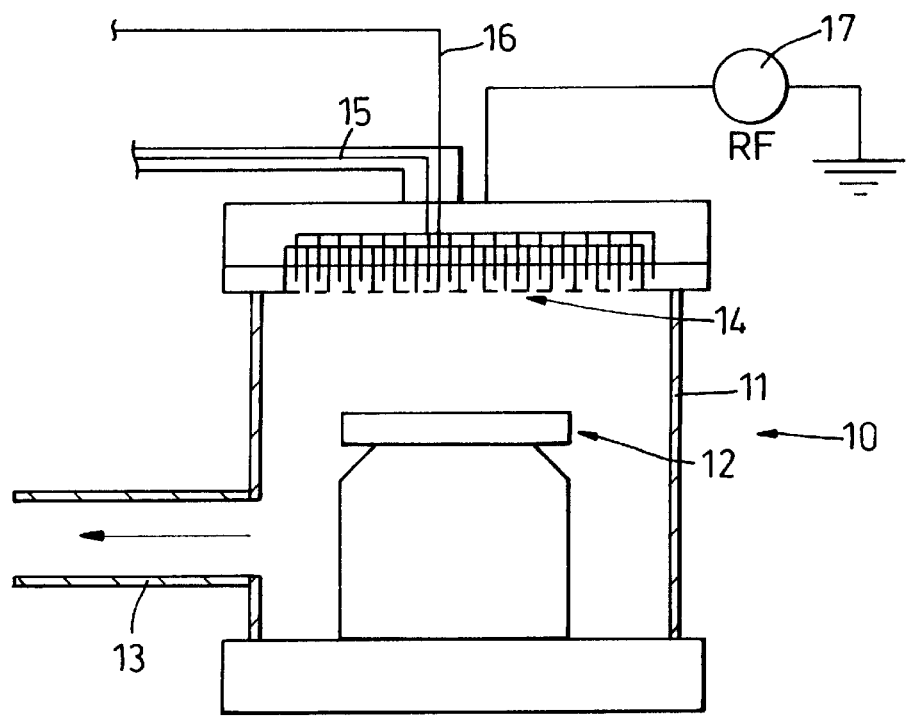
FIG. 1 is a schematic view of a plasma reactor chamber with a traditional shower head diagrammatically illustrated.

Referring first to FIG. 1, a plasma reactor chamber, generally indicated at 10, comprises a chamber 11, a workpiece support 12, a vacuum pump outlet 13, a shower head 14, first and second gas supplies 15 and 16 and an RF power source 17, which is connected to the shower head 14, which acts as an electrode for striking the plasma.

The shower head 14 is essentially as described in the preamble to this specification and it delivers the gases supplied by 15 and 16 in an unmixed state to the chamber 11. A plasma is struck and the desired process is carried out on a wafer supported on the support 12.

Figure 2:
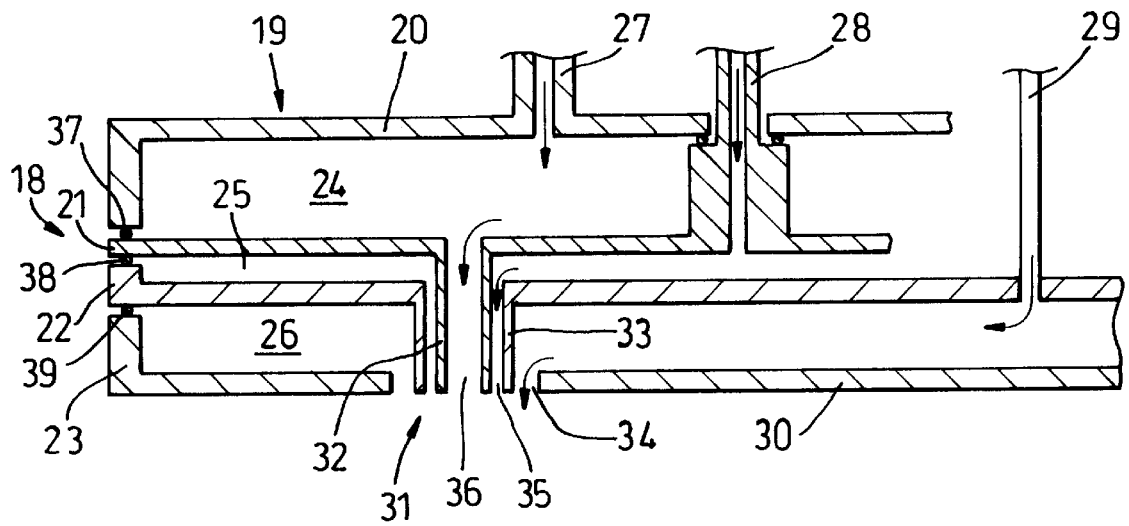
FIG. 2 is a scrap cross-sectional view through part of a shower head made in accordance with the invention (the drawing is not to scale)

Referring now to FIG. 2 the shower head of the present invention is generally indicated at 18 and comprises a casing 19, which includes a backing plate 20, first and second baffle plates 21, 22 and an outlet plate 23. The baffle plates 21 and 22 divide the volume defined by the casing 19 into plena 24, 25 and 26. A gas supply 27 feeds the plenum 24; a gas supply 28 feeds the plenum 25 and a further gas supply 29 feeds the plenum 26.

The outlet plate 23 has an array of openings across its face 30 and one of this is illustrated at 31.

Each of the baffle plates 21 and 22 has a tube for each opening 31. The tubes 32 from plate 21 descend down through the tubes 33 from plate 22 and each of these tubes project into the opening 31, or into the region thereof, so that the outer tube 33 defines a circumjacent outlet 34 with the opening 31.

The result of this configuration is respective concentric outlets 34, 35 and 36 which are respectively and separately connected to the plena 26, 25 and 24. Thus gases supplied to inlets 27, 28 and 29 are delivered into the chamber 11 across the face 30 and in a unmixed state prior to their introduction into the chamber 11.

As can be seen the baffle plates 21 and 22 are simply sandwiched, using O rings 37 to 39, between the backing plate 20 and the outlet plate 23.

The new design has a number of significant advantages. First it gets rid of the need for the rubber gasket and the difficulties of construction and assembly, as well as those of use as mentioned above. Secondly, because it is no longer necessary to provide a seal with that gasket, the flexibility of the opening plate 30 no longer becomes a significant issue. Further the design allows more than two gases to be mixed and by having a supply of baffle plates, various configurations can be swiftly made up. Thus for example it is possible, by selecting different baffle plates with different tube dimensions to vary the relative dimensions of the outlet 34, 35 and 36 and hence, if the gas pressures are equal to define the relative flow rates of the gases. The use of concentric tubes is particularly convenient, but it would be feasible to utilise side by side tubes, provided that suitable seals enable such tubes to pass through intermediate baffle plates without allowing gas mixing.

FIGS. 3 to 5 illustrate the actual construction of a baffle plate suitable for use in a two gas version of the shower head. The construction of tubes 32 is particularly illustrated.

I claim:

1. A shower head for delivering unmixed gases or vapours to a reactor chamber including a casing defining a volume and having an outlet plate defining a plurality of openings and a baffle plate extending across the volume to define first and second gas plena on respective sides hereof, the first plenum being on the outlet side of the baffle plate and the baffle plate having projecting tubes passing through the first plenum to communicate with the respective openings, wherein the tubes project into the first plenum to define, with respective openings, circumjacent outlets for the first plenum.

2. A shower head as claimed in claim 1 wherein the first plenum is in direct communication with the circumjacent outlets.

3. A shower head as claimed in claim 2 wherein outlets in each group of outlets are concentric.

4. A shower head as claimed in claim 1 or claim 2 further including a further baffle plate located on the other side of the second plenum from the first baffle plate to define with the casing or an extension thereof a third plenum, the further baffle plate having further tubes which extend through respective ones of the first set of tubes to form further outlets.

5. A shower head as claimed in claim 4 wherein the areas of the tube outlets and the circumjacent outlets are substantially equal.

6. A shower head as claimed in claim 4 wherein outlets in each group of outlets are concentric.

7. A shower head as claimed in claim 1 or 2 preceding claims wherein the areas of the tube outlets and the circumjacent outlets are substantially equal.

8. A shower head as claimed in claim 7 wherein outlets in each group of outlets are concentric.

9. A shower head as claimed in claim 1 wherein outlets in each group of outlets are concentric.

* * * * *